US012701968B2

(12) United States Patent
Watabe et al.

(10) Patent No.: US 12,701,968 B2
(45) Date of Patent: Aug. 4, 2026

(54) INSPECTION DEVICE, INSPECTION METHOD OF SEMICONDUCTOR SUBSTRATE, MANUFACTURING METHOD OF SEMICONDUCTOR SUBSTRATE, AND MANUFACTURING METHOD OF SEMICONDUCTOR DEVICE

(71) Applicant: Mitsubishi Electric Corporation, Tokyo (JP)

(72) Inventors: Shunichi Watabe, Tokyo (JP); Tamio Matsumura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1190 days.

(21) Appl. No.: 17/590,435

(22) Filed: Feb. 1, 2022

(65) Prior Publication Data

US 2022/0336293 A1 Oct. 20, 2022

(30) Foreign Application Priority Data

Apr. 19, 2021 (JP) ................................. 2021-070478

(51) Int. Cl.
*H01L 21/66* (2006.01)
*H01L 21/683* (2006.01)
(Continued)

(52) U.S. Cl.
CPC ............ *H10P 74/203* (2026.01); *H10P 72/78* (2026.01)

(58) Field of Classification Search
CPC ................. H01L 22/12; H01L 21/6838; H01L 21/68714; H01L 21/67242; H10P 74/203; H10P 72/78; H10P 72/7604; H10P 72/06
See application file for complete search history.

(56) References Cited

U.S. PATENT DOCUMENTS 7,078,262 B2 * 7/2006 Yamamoto ........ H01L 21/67132
438/758
2010/0013058 A1 1/2010 Shibata et al.

FOREIGN PATENT DOCUMENTS

CN 101578699 A 11/2009
CN 107408530 A 11/2017
(Continued)

OTHER PUBLICATIONS

An Office Action issued by the State Intellectual Property Office of the People's Republic of China on May 27, 2024, which corresponds to Chinese Patent Application No. CN 202210389126.7.
(Continued)

*Primary Examiner* — Dale E Page
*Assistant Examiner* — Quovaunda Jefferson
(74) *Attorney, Agent, or Firm* — Studebaker Brackett PLLC

(57) ABSTRACT

An inspection device is an inspection device that inspects a semiconductor substrate. The inspection device includes a stage, a first ring, and a second ring. A first recess is provided on an upper surface of the stage. The first recess has a ring shape in plan view. The first ring is elastic. The first ring is disposed in the first recess. The second ring presses the first ring in an inward direction of the ring shape so as to press the first ring toward an inner side surface of a side surface of the first recess. The first ring projects toward an upper side further than the upper surface of the stage. In the stage, an exhaust hole is provided. The semiconductor substrate placed on the first ring is vacuum-sucked with exhaustion through the exhaust hole.

26 Claims, 17 Drawing Sheets

(51) Int. Cl.
　　H10P 72/78　　　　(2026.01)
　　H10P 74/20　　　　(2026.01)

(56)　　　　　　　References Cited

FOREIGN PATENT DOCUMENTS

| | | | |
|---|---|---|---|
| JP | H105-145086 | A | 6/1993 |
| JP | 2009-124104 | A | 6/2009 |
| JP | 2009-206417 | A | 9/2009 |
| JP | 2013-118242 | A | 6/2013 |
| JP | 2017-045816 | A | 3/2017 |
| JP | 2017-220483 | A | 12/2017 |
| WO | 2017/086333 | A1 | 5/2017 |

OTHER PUBLICATIONS

An Office Action issued by the German Patent and Trademark Office on Feb. 28, 2025, which corresponds to German Patent Application No. 102022106618.5 and is related to U.S. Appl. No. 17/590,435; with English language translation.

An Office Action mailed by the Japanese Patent Office on Jan. 23, 2024, which corresponds to Japanese Patent Application No. 2021-070478 and is related to U.S. Appl. No. 17/590,435; with English language translation.

* cited by examiner

F I G.   1
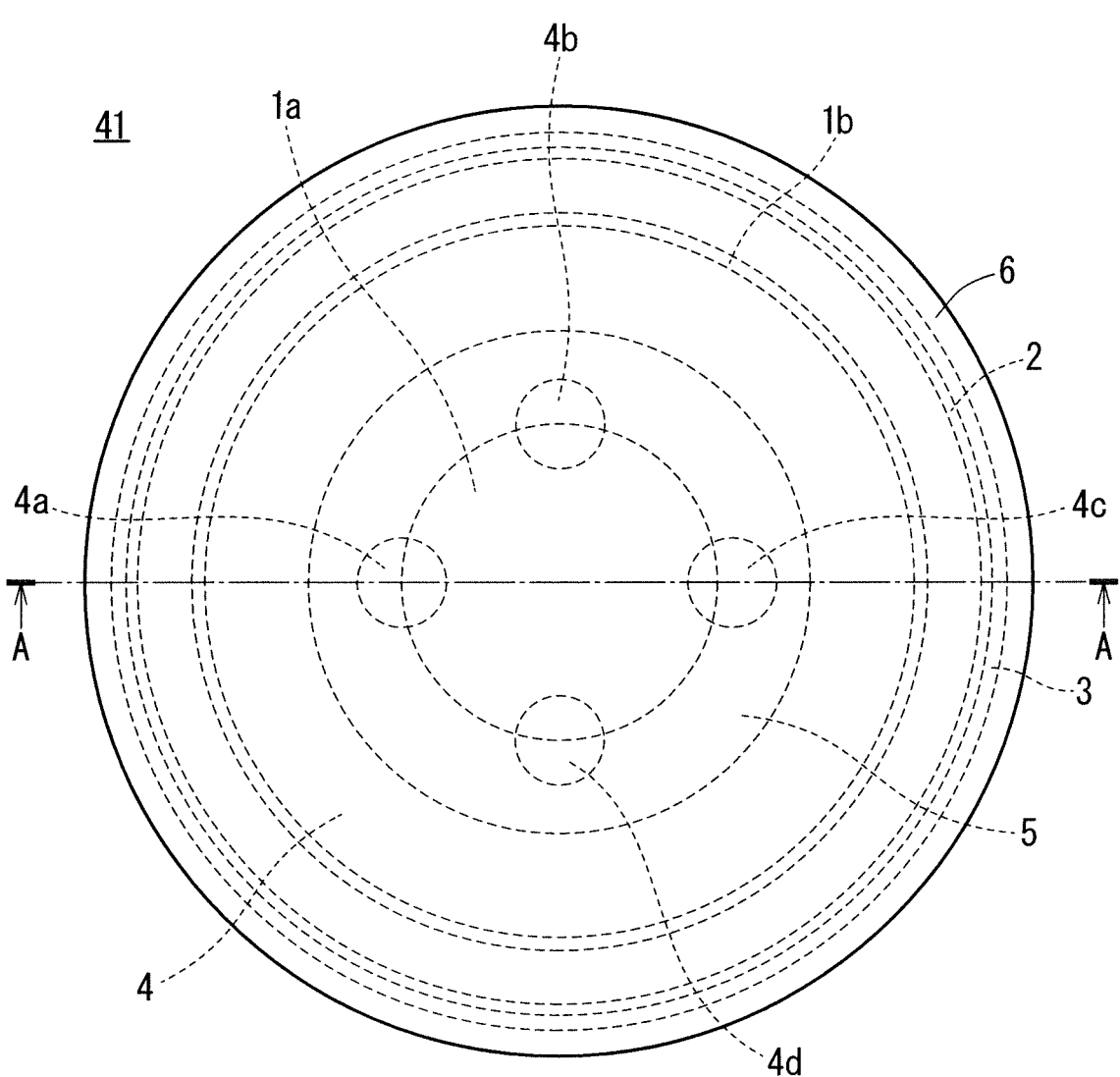

F I G .  2
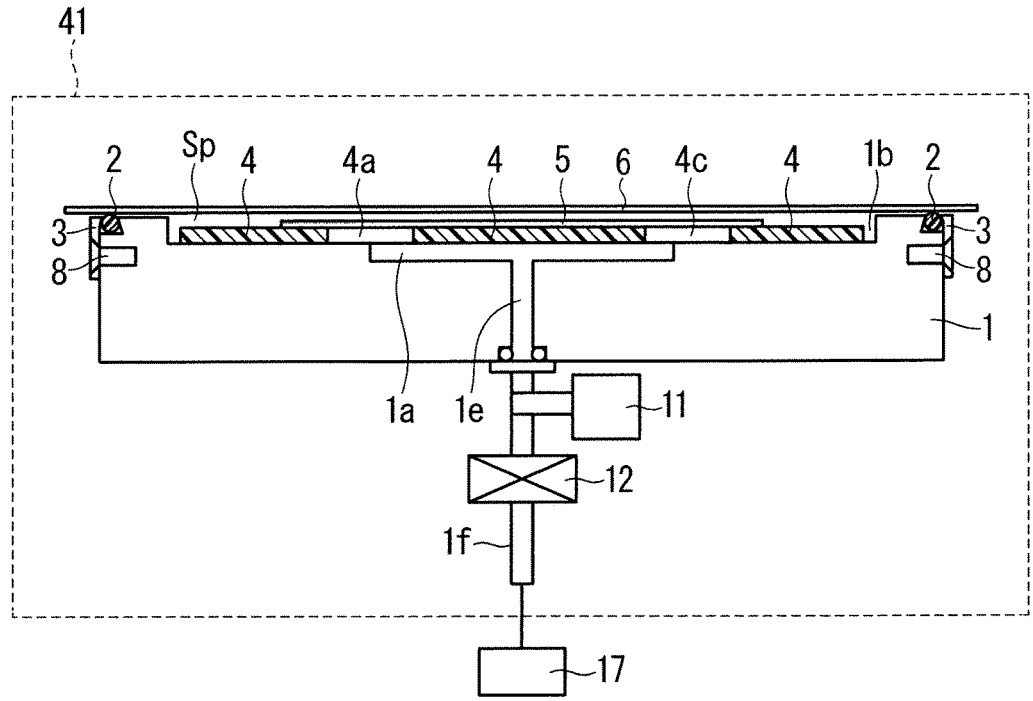
F I G .  3
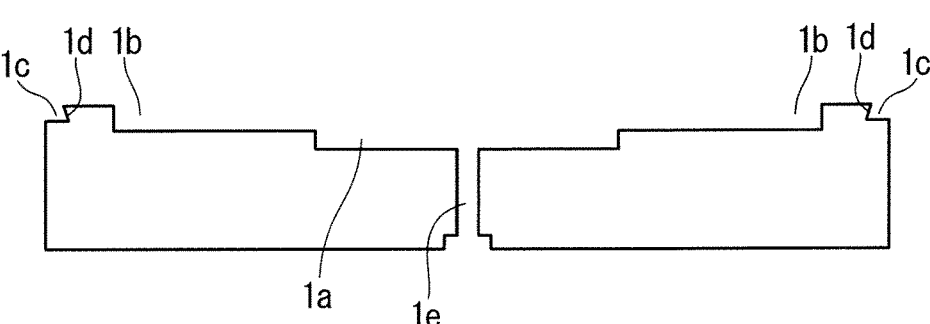
F I G .  4
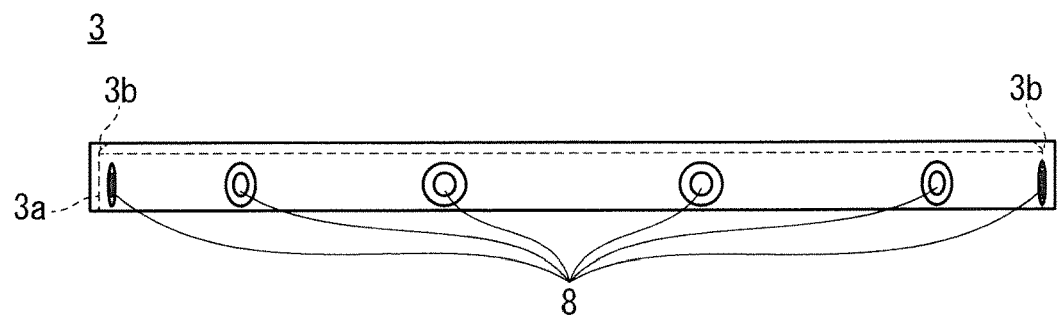

F I G.  5
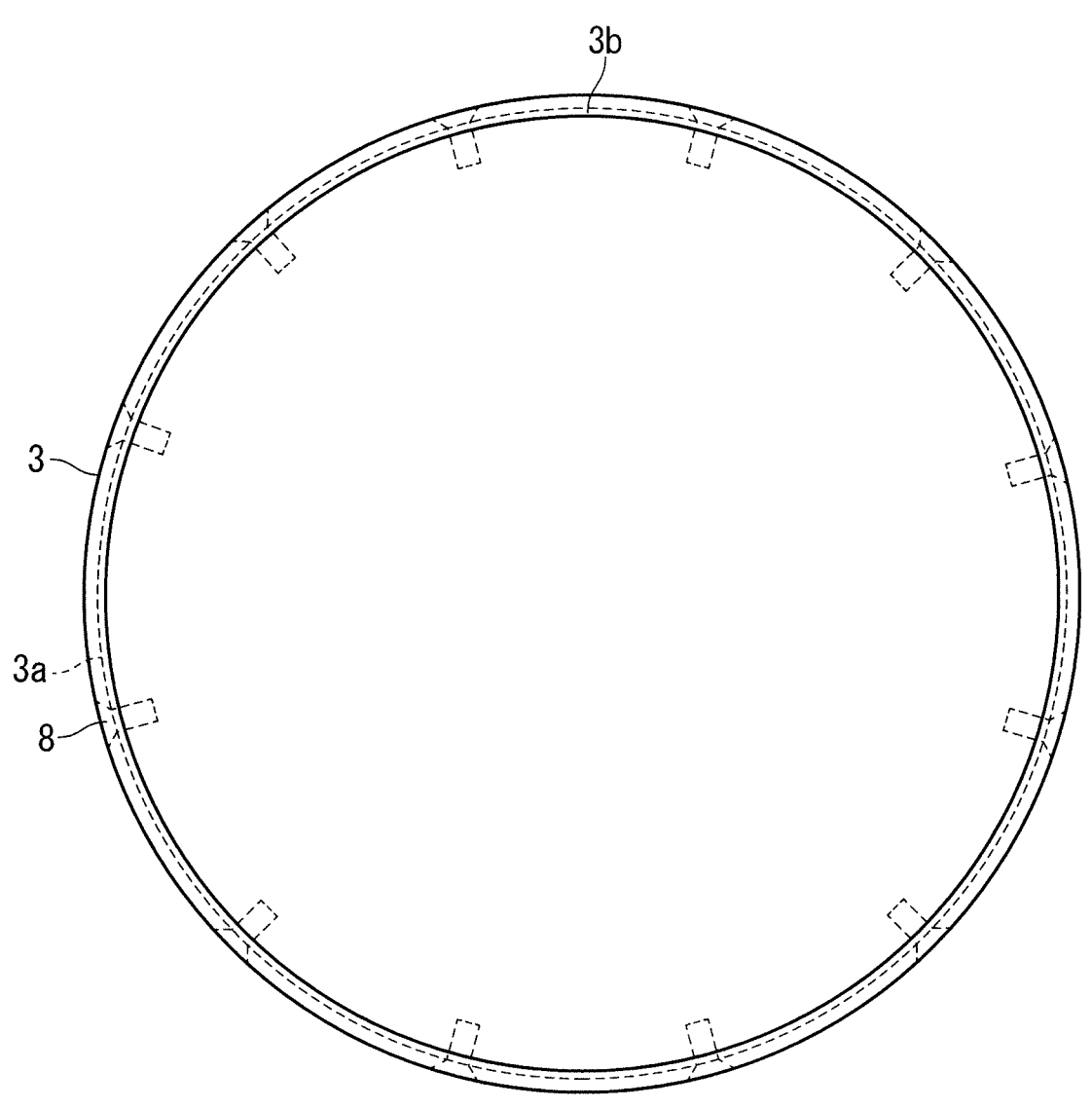

F I G.  6
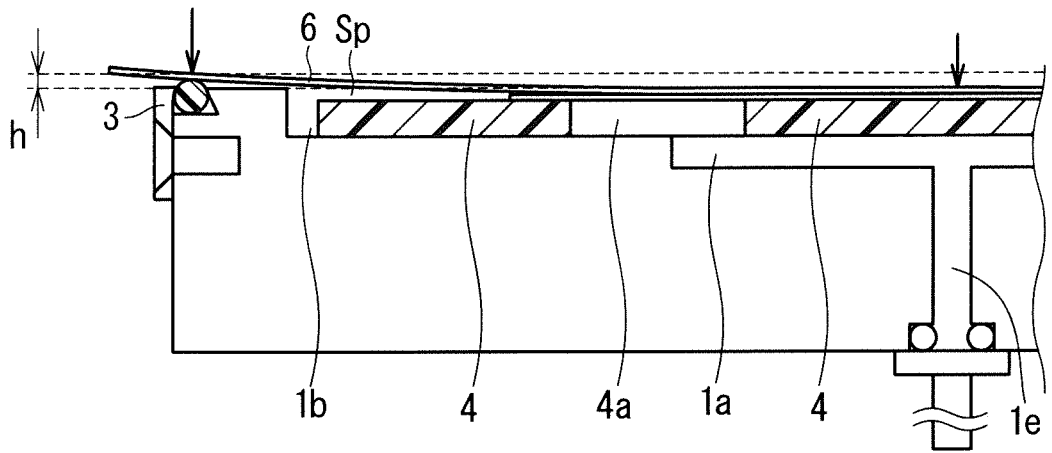
F I G.  7
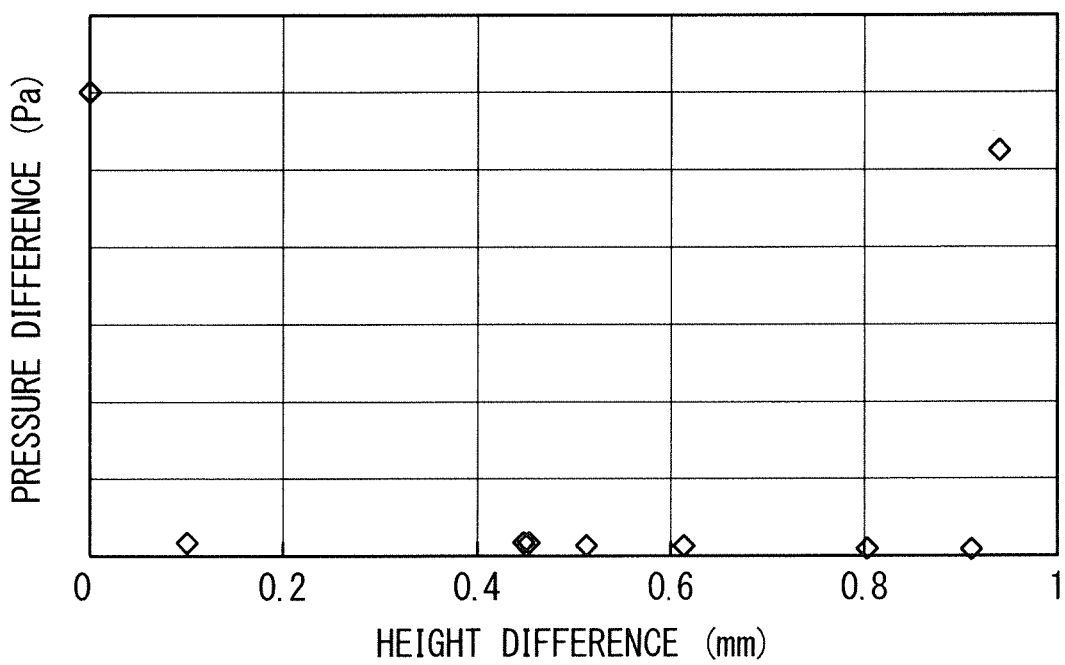

F I G . 8
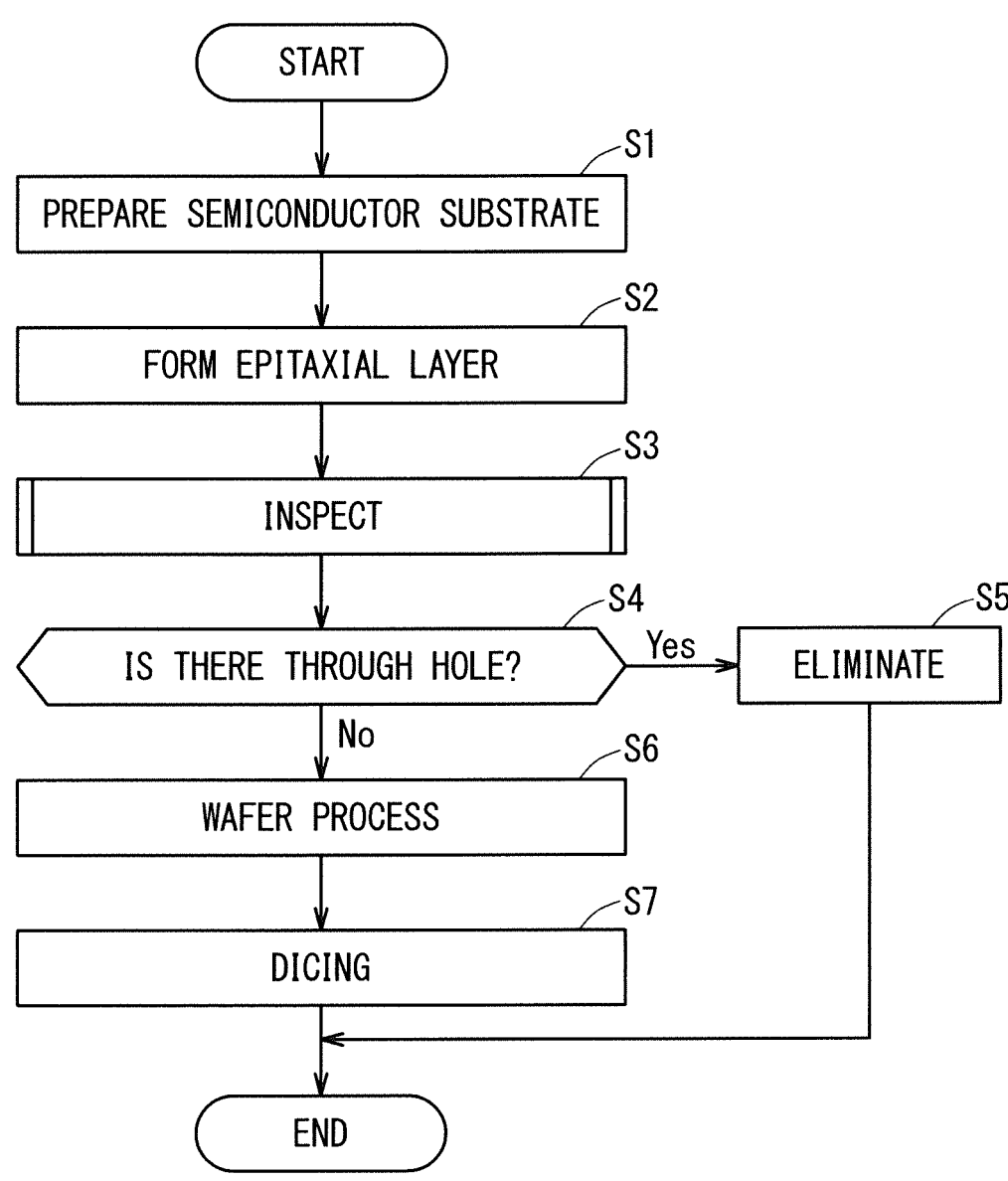

F I G. 9
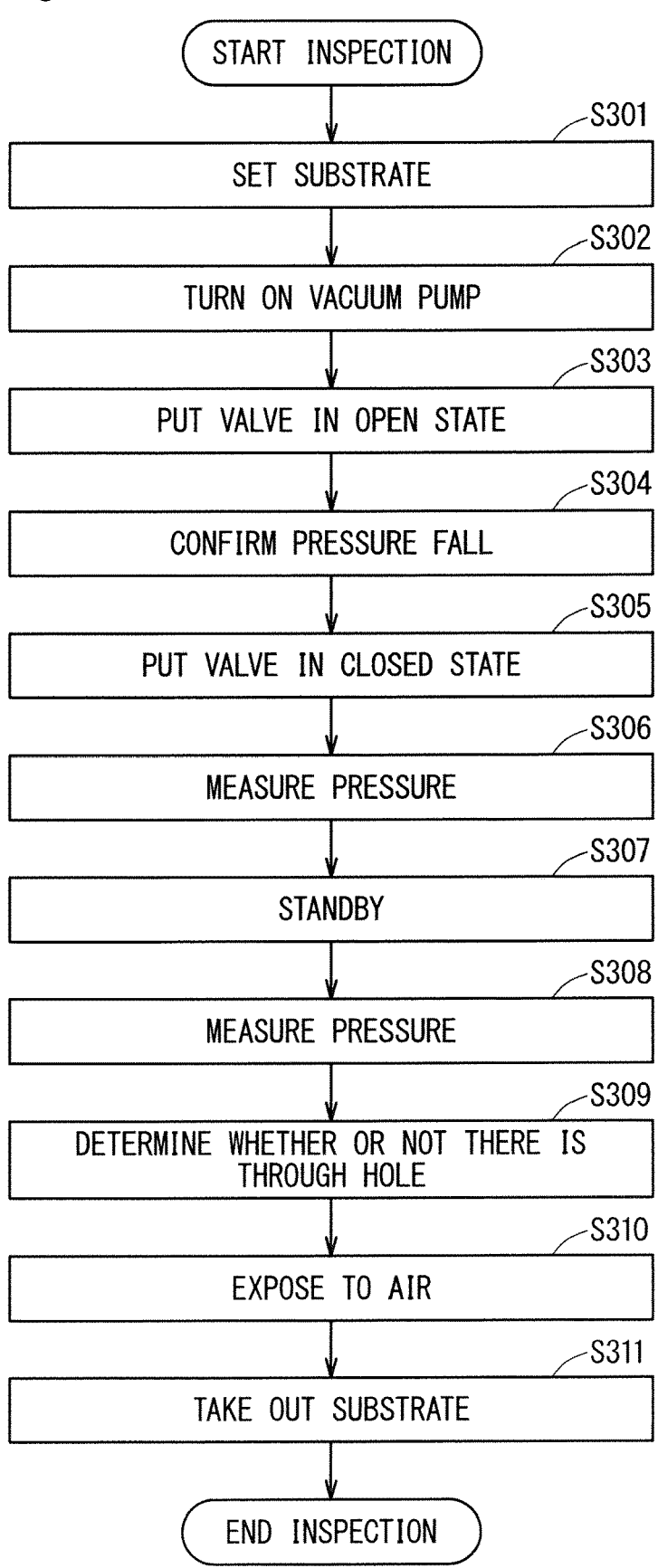

F I G.  1 0
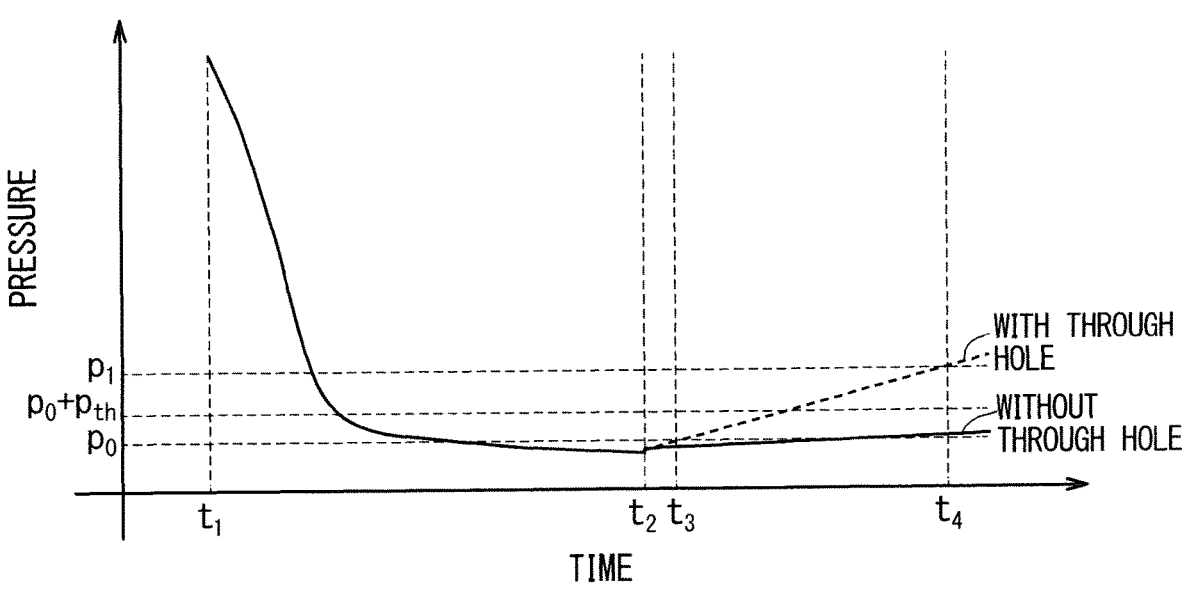

F I G.  1 1
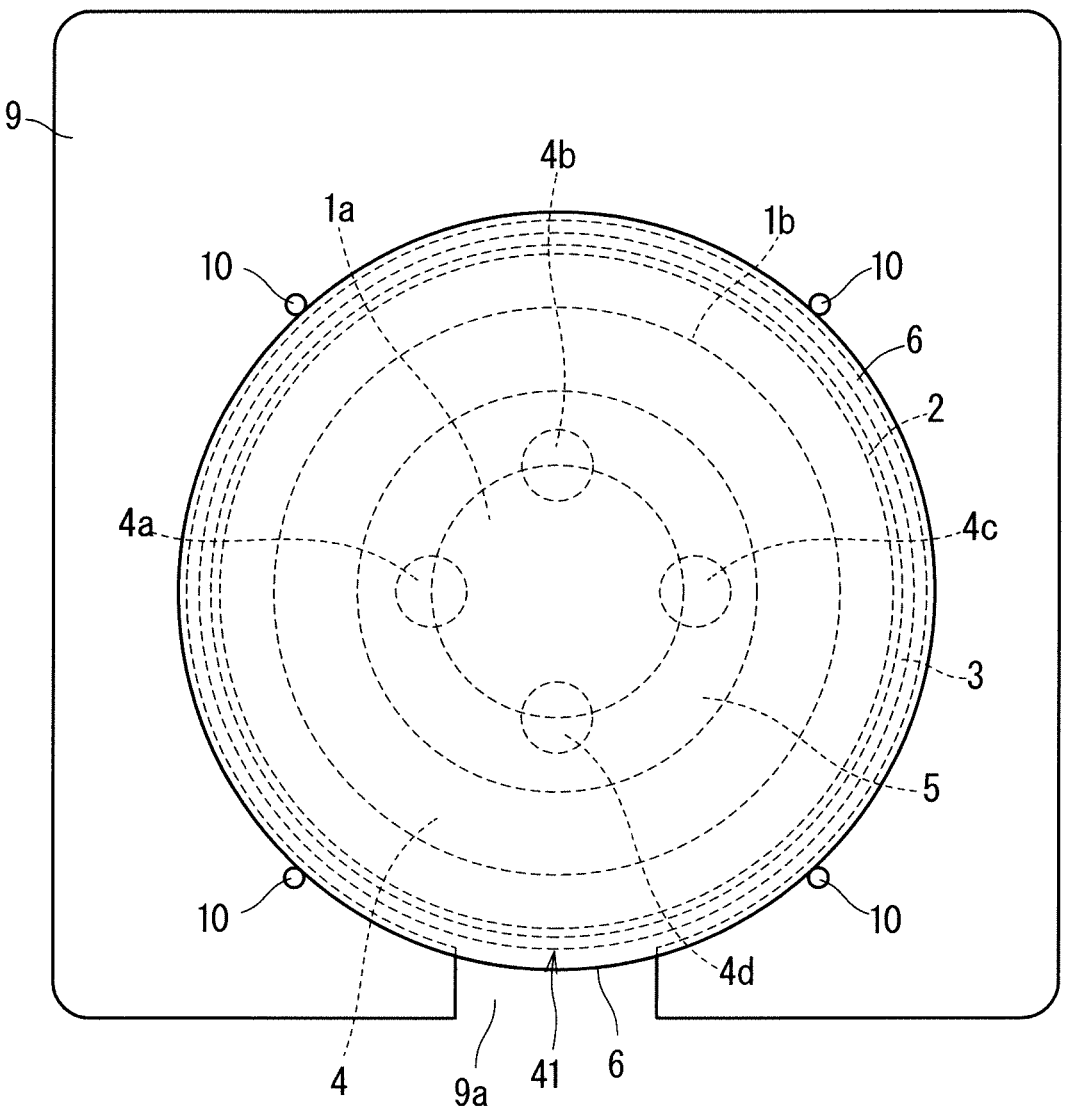

F I G. 1 3
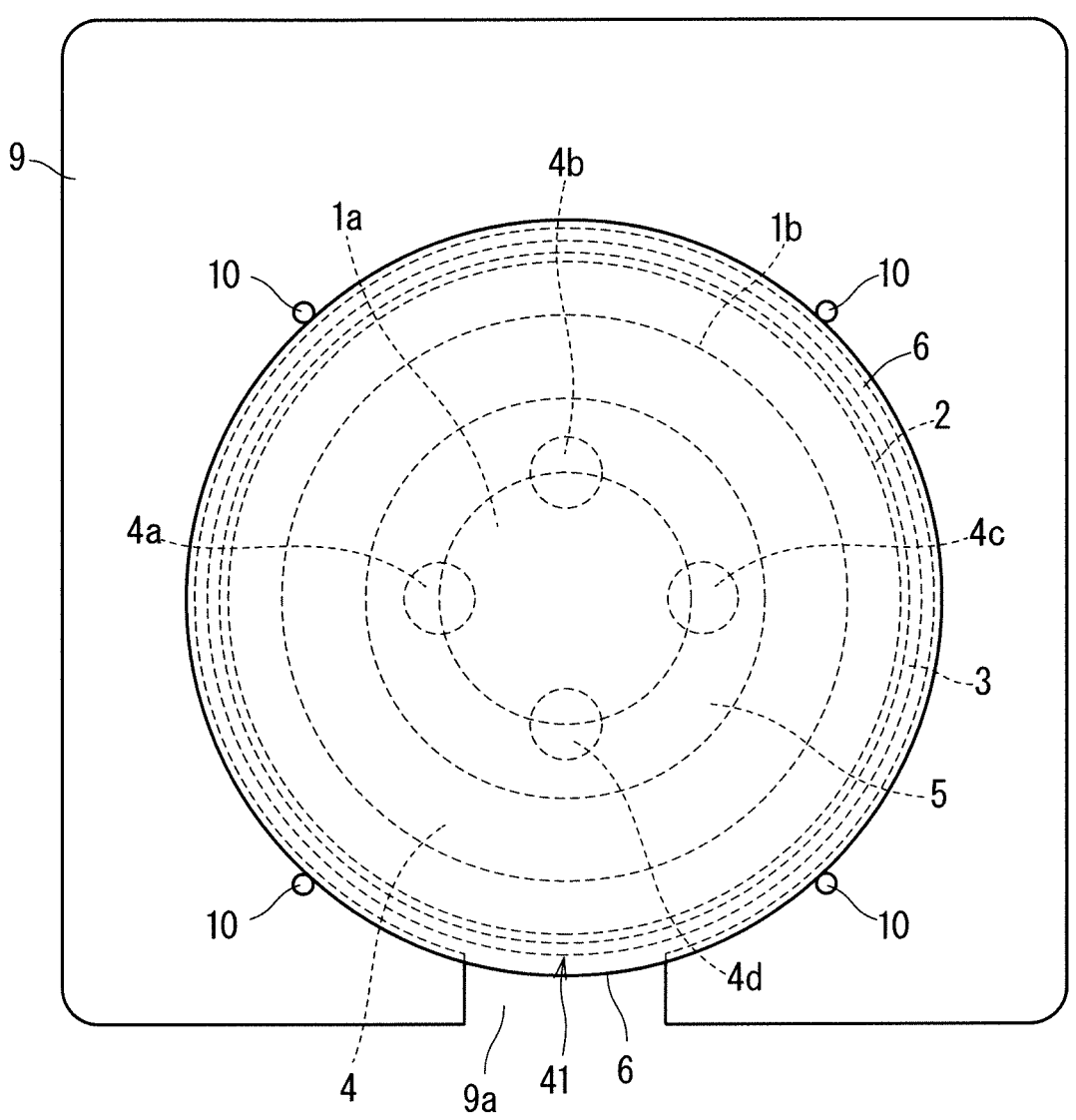

F I G． 1 4
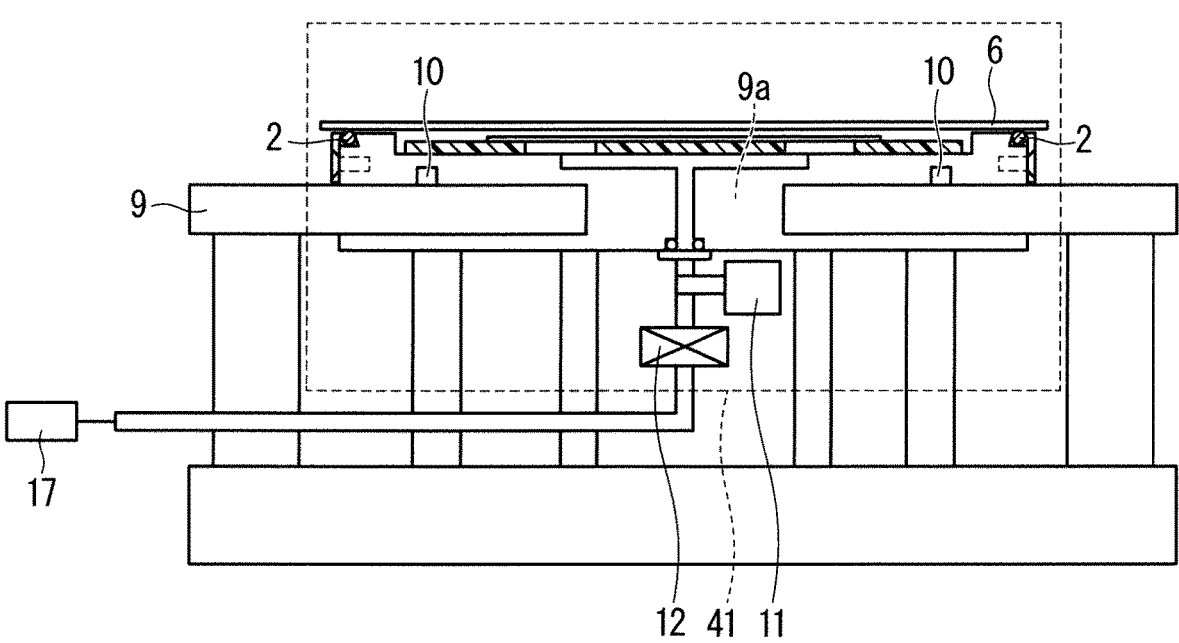

F I G.   1 5

F I G.　1 6
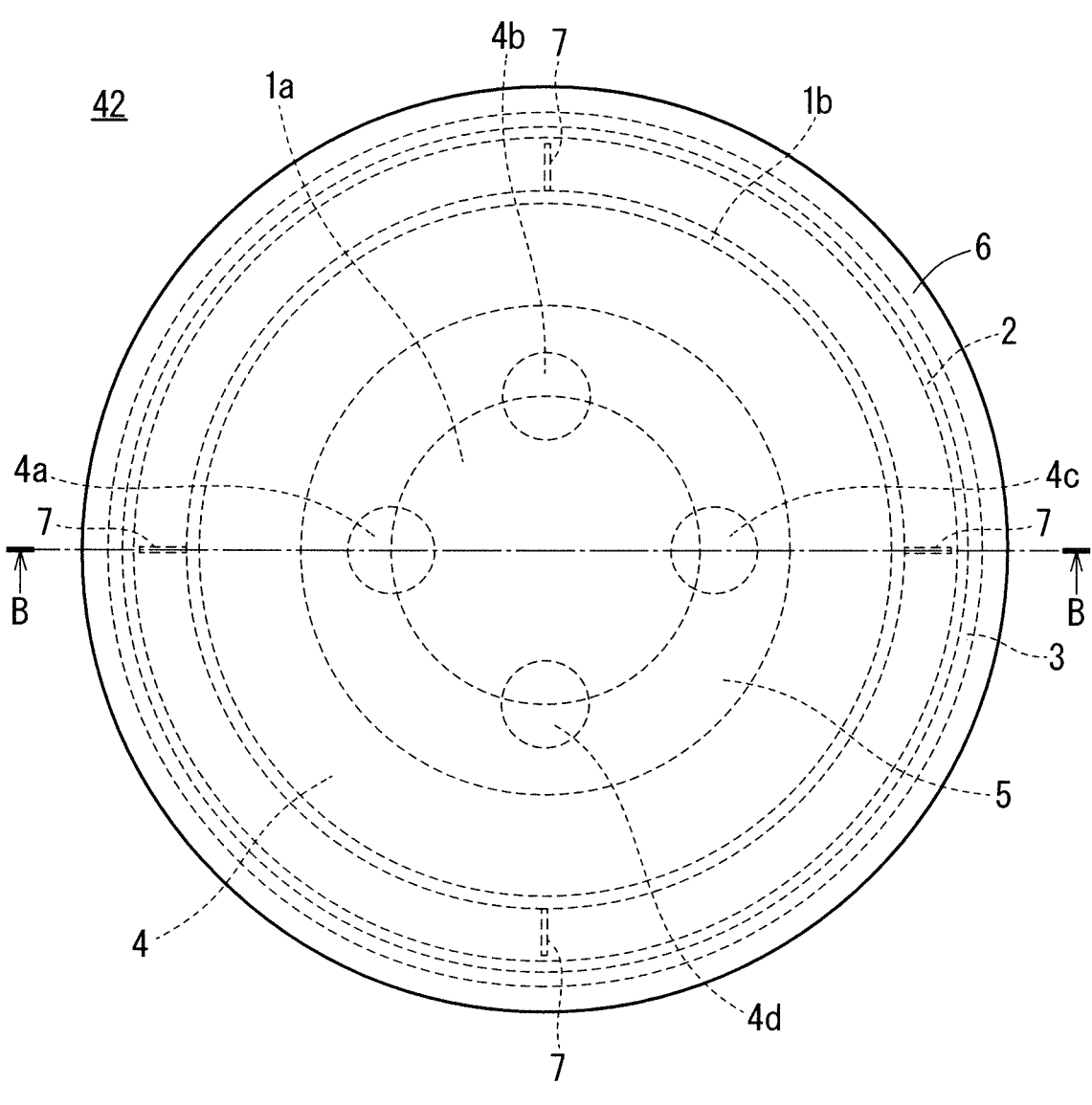

F I G.   1 7
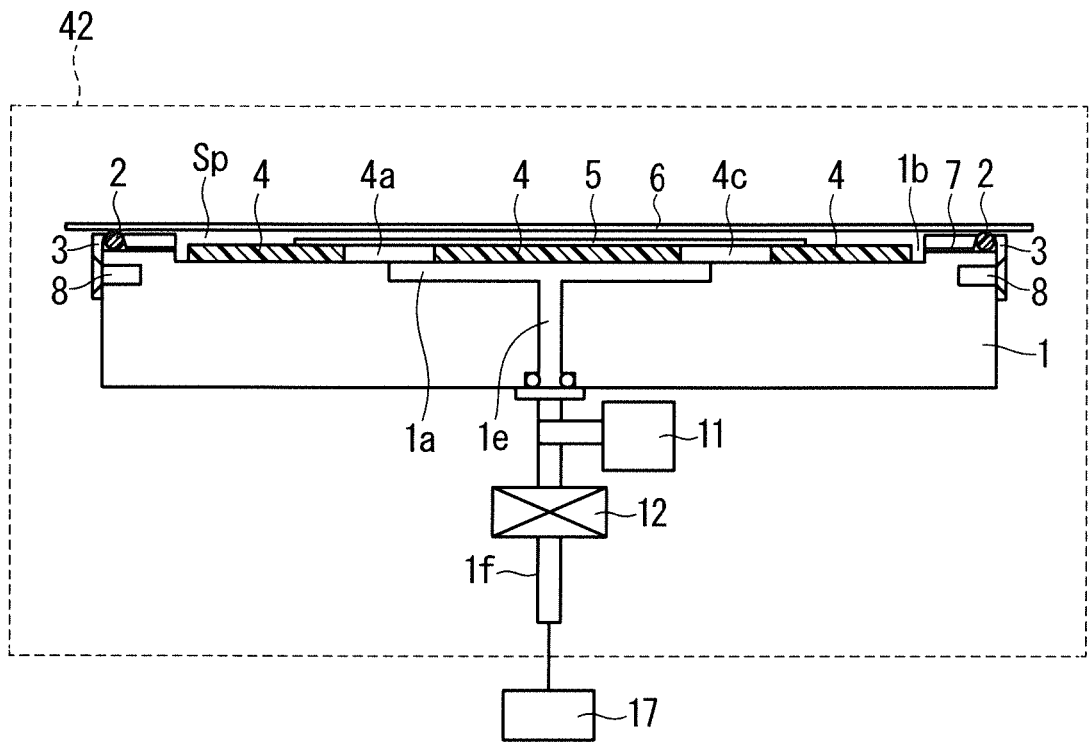

F I G.   1 8
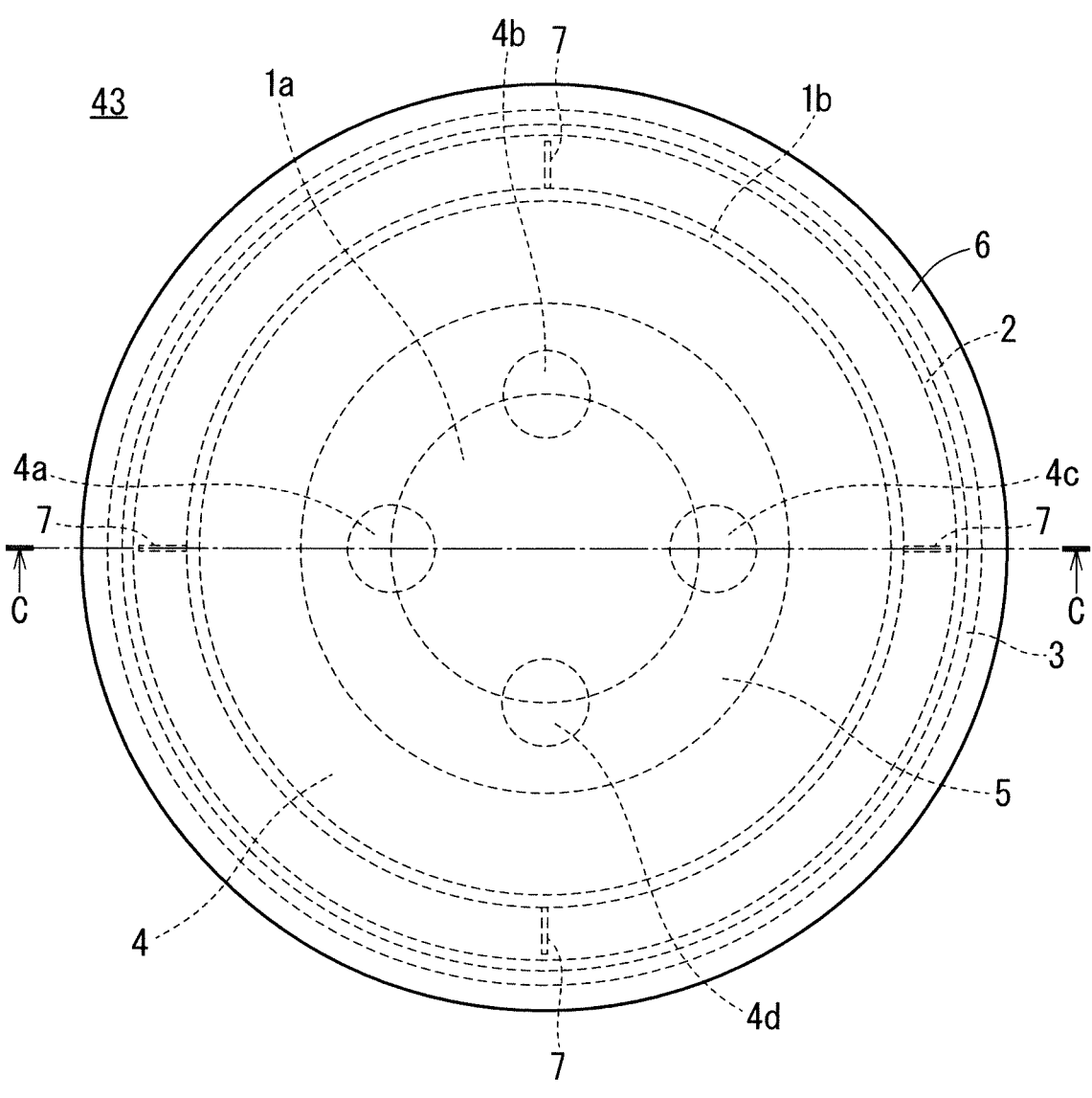

200

F I G.  2 1
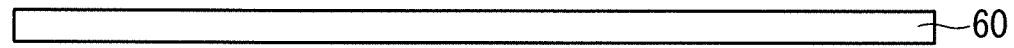
~60
F I G.  2 2
<u>6</u>
~61
~60

INSPECTION DEVICE, INSPECTION METHOD OF SEMICONDUCTOR SUBSTRATE, MANUFACTURING METHOD OF SEMICONDUCTOR SUBSTRATE, AND MANUFACTURING METHOD OF SEMICONDUCTOR DEVICE

BACKGROUND OF THE INVENTION

Field of the Invention

The present disclosure relates to an inspection device, an inspection method of a semiconductor substrate, a manufacturing method of a semiconductor substrate, and a manufacturing method of a semiconductor device.

Description of the Background Art

Japanese Patent Application Laid-Open No. 2009-206417 discloses a manufacturing method of a semiconductor device using a semiconductor substrate.

The semiconductor substrate may have a through hole, which is a hole penetrating from a front surface to a back surface of the semiconductor substrate. When a semiconductor device is manufactured using the semiconductor substrate having a through hole, a problem occurs in a process for manufacturing the semiconductor device, leading to reduction of productivity. Thus, whether or not a semiconductor substrate has a through hole is desirably inspected. However, a known device is not appropriate for inspecting whether or not a semiconductor substrate has a through hole.

SUMMARY

The present disclosure has an object to provide an inspection device appropriate for inspecting whether or not a semiconductor substrate has a through hole.

An inspection device according to the present disclosure is an inspection device that inspects a semiconductor substrate. The inspection device includes a stage, a first ring, and a second ring. A first recess is provided on an upper surface of the stage. The first recess has a ring shape in plan view. The first ring is elastic. The first ring is disposed in the first recess. The second ring presses the first ring in an inward direction of the ring shape so as to press the first ring toward an inner side surface of a side surface of the first recess. The first ring projects toward an upper side further than the upper surface of the stage. In the stage, an exhaust hole is provided, the exhaust hole including an opening in a region of the upper surface of the stage surrounded by the first recess in plan view. The inspection device vacuum-sucks the semiconductor substrate placed on the first ring with exhaustion through the exhaust hole.

According to the present disclosure, an inspection device appropriate for inspecting whether or not a semiconductor substrate has a through hole is provided.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a diagram illustrating an inspection unit of an inspection device according to the first embodiment.

FIG. 2 is a diagram illustrating the inspection unit of the inspection device according to the first embodiment.

FIG. 3 is a diagram illustrating an inspection stage of the inspection device according to the first embodiment.

FIG. 4 is a diagram illustrating a ring of the inspection device according to the first embodiment.

FIG. 5 is a diagram illustrating the ring of the inspection device according to the first embodiment.

FIG. 6 is a diagram illustrating the inspection stage of the inspection device according to the first embodiment.

FIG. 7 is a diagram illustrating a relationship between a height difference of a semiconductor substrate and a leakage degree of outside air in inspection using the inspection device according to the first embodiment.

FIG. 8 is a flowchart illustrating a manufacturing method of the semiconductor device according to the first embodiment.

FIG. 9 is a flowchart illustrating an inspection method according to the first embodiment.

FIG. 10 is a diagram schematically illustrating variation of pressure in the inspection method according to the first embodiment.

FIG. 11 is a diagram illustrating the inspection unit and a substrate guide of the inspection device according to the first embodiment.

FIG. 13 is a diagram illustrating the inspection unit and the substrate guide of the inspection device according to the first embodiment.

FIG. 14 is a diagram illustrating the inspection unit and the substrate guide of the inspection device according to the first embodiment.

FIG. 15 is a diagram illustrating the inspection device according to the first embodiment.

FIG. 16 is a diagram illustrating the inspection unit of the inspection device according to the second embodiment.

FIG. 17 is a diagram illustrating the inspection unit of the inspection device according to the second embodiment.

FIG. 18 is a diagram illustrating the inspection unit of the inspection device according to the third embodiment.

FIG. 21 is a diagram for illustrating the manufacturing method of the semiconductor device according to the first embodiment.

FIG. 22 is a diagram for illustrating the manufacturing method of the semiconductor device according to the first embodiment.

DESCRIPTION OF THE PREFERRED EMBODIMENTS

Figure 12:
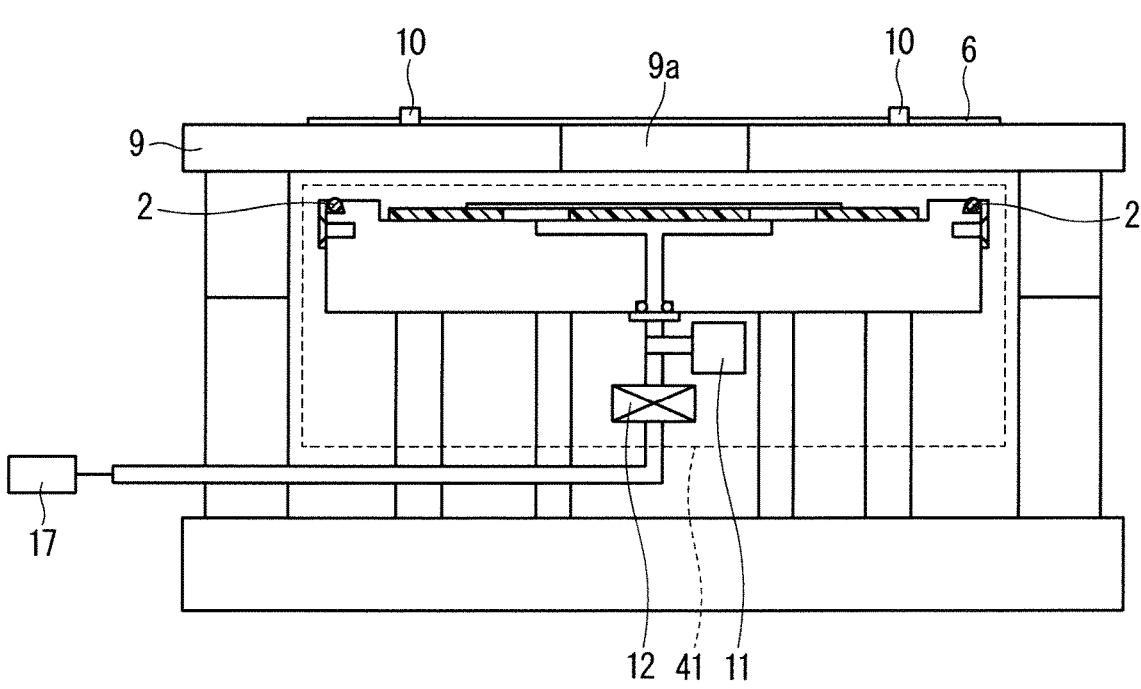
FIG. 12 is a diagram illustrating the inspection unit and the substrate guide of the inspection device according to the first embodiment.

In the following description, regarding the expressions of "up" and "low", a direction of an inspection device, a semiconductor substrate, or a semiconductor device is represented as an upper direction and a direction opposite to the upper direction is represented as a lower direction, and those expressions are not to limit upper and lower directions when the inspection device, the semiconductor substrate, or the semiconductor device is manufactured or used.

A. First Embodiment

<A-1. Structure>

FIG. 15 is a schematic diagram illustrating an inspection device 101 according to the present embodiment.

The inspection device 101 includes a substrate container 13, a conveyor hand 14, an aligner 15, a vacuum pump 17, a substrate guide 9, and an inspection unit 41.

FIG. 1 is a plan view of the inspection unit 41. FIG. 2 is a cross-sectional diagram of the inspection unit 41 taken along the line A-A of FIG. 1. In FIG. 1 and FIG. 2, a semiconductor substrate 6 being a target to be inspected by the inspection unit 41 is also illustrated.

As illustrated in FIG. 1 and FIG. 2, the inspection unit 41 includes an inspection stage 1, an O-ring 2 (an example of a first ring), a ring 3 (an example of a second ring), a sheet 4 (an example of a first sheet), a porous sheet 5 (an example of a second sheet), screws 8, a vacuum gauge 11, and a valve 12.

FIG. 3 is a cross-sectional diagram of the inspection stage 1 taken along the line A-A of FIG. 1, and is a diagram of the inspection stage 1 being taken out from FIG. 2. As illustrated in FIG. 3, on the upper surface of the inspection stage 1, a recess 1c (an example of a first recess) is provided. The recess 1c has a ring shape in plan view. The recess 1c is a recess provided at a corner part between the upper surface and the side surface of the inspection stage 1.

The O-ring 2 is an elastic ring. The O-ring 2 is disposed in the recess 1c in such a manner that the O-ring 2 surrounds the ring shape of the recess 1c.

The ring 3 is attached to the side surface of the inspection stage 1 by the screws 8. In a state in which the ring 3 is attached to the inspection stage 1, the width between the ring 3 and an inner side surface 1d (see FIG. 3) of the recess 1c of the inspection stage 1 is smaller than the wire diameter of the O-ring 2. The inner side is a side in the center direction of the ring shape of the recess 1c in plan view.

The ring 3 presses the O-ring 2 toward the inner side, and presses the O-ring 2 toward the inner side surface 1d of the side surface of the recess 1c. In other words, the O-ring 2 is pressed and compressed from both the sides of the inner side and the outer side by the inner side surface 1d of the recess 1c and the ring 3.

The upper edge of the O-ring 2 disposed in the recess 1c projects toward the upper side further than the upper surface of the inspection stage 1. The upper edge of the O-ring 2 disposed in the recess 1c projects toward the upper side further than the upper surface of the inspection stage 1 at least in a state of being pressed toward the side surface 1d of the inspection stage 1 by the ring 3. The depth of the recess 1c is such a depth that the upper edge of the O-ring 2 projects toward the upper side further than the upper surface of the inspection stage 1 in a state in which the O-ring 2 disposed in the recess 1c comes in contact with the bottom surface of the recess 1c. The depth of the recess 1c is, for example, smaller than the wire diameter of the O-ring 2.

The semiconductor substrate 6 is placed on the O-ring 2 being disposed in the recess 1c.

In the inspection stage 1, an exhaust hole 1e is provided. The exhaust hole 1e has an opening 1a in a region of the upper surface of the inspection stage 1 surrounded by the recess 1c in plan view. The exhaust hole 1e is connected to a pipe 1f. The pipe 1f is connected to the vacuum pump 17.

In the pipe 1f, the valve 12 is set between the exhaust hole 1e and the vacuum pump 17.

In the pipe 1f, the vacuum gauge 11 is connected between the exhaust hole 1e and the valve 12.

When the valve 12 is in a closed state, a space Sp surrounded by the semiconductor substrate 6, the O-ring 2, the inspection stage 1, and the valve 12 is a space having high airtightness. The vacuum gauge 11 is a pressure gauge that measures the degree of vacuum in the space Sp.

When the vacuum pump 17 operates, the space Sp is evacuated with exhaustion through the exhaust hole 1e. When the space Sp is evacuated, the inspection stage 1 vacuum-sucks the semiconductor substrate 6 placed on the O-ring 2.

When there is a through hole in the semiconductor substrate 6, the degree of vacuum of the space Sp deteriorates due to leakage through the through hole. Accordingly, by detecting deterioration of the degree of vacuum of the space Sp using the vacuum gauge, whether or not there is a through hole in the semiconductor substrate 6 can be inspected.

In order to enhance sensitivity of inspection as to whether or not there is a through hole in the semiconductor substrate 6, it is preferable that airtightness of the space Sp be high. In other words, it is preferable that the amount of leakage of outside air to the space Sp through a portion other than the through hole of the semiconductor substrate 6 be small.

If the volume of the space Sp is small, a leakage of the same amount of outside air leads to greater deterioration in the degree of vacuum, and thus deterioration of the degree of vacuum can be easily detected. Therefore, in order to enhance sensitivity of inspection as to whether or not there is a through hole in the semiconductor substrate 6, it is preferable that the volume of the space Sp be small.

When the O-ring 2 on which the semiconductor substrate 6 is placed is elastic, outside air is made less liable to leak to the space Sp through a portion between the semiconductor substrate 6 and the O-ring 2. As a result, airtightness of the space Sp is enhanced.

When the O-ring 2 is pressed toward the inner side surface 1d of the recess 1c of the inspection stage 1 by the ring 3, outside air is made less liable to leak to the space Sp through a portion between the O-ring 2 and the inspection stage 1. As a result, airtightness of the space Sp is enhanced.

When the O-ring 2 is pressed toward the inner side surface 1d of the recess 1c of the inspection stage 1 by the ring 3, the O-ring 2 is made less liable to move upward at the time of dechucking of the semiconductor substrate 6 after inspection.

The inner side surface 1d of the recess 1c inclines so as to be located more on the outer side on the upper side. With this, the O-ring 2 is made less liable to move upward at the time of dechucking of the semiconductor substrate 6.

FIG. 4 is a side view of the ring 3. FIG. 5 is a plan view of the ring 3. In FIG. 4 and FIG. 5, disposition of the screws 8 are also illustrated.

An inner circumferential surface 3a of the ring 3 includes a protrusion 3b that protrudes toward the inner side at the upper end portion. With this, the O-ring 2 is made less liable to move upward at the time of dechucking.

When the O-ring 2 is made less liable to move upward at the time of dechucking of the semiconductor substrate 6, the airtightness of the space Sp is made less liable to be reduced, which causes detection sensitivity in the next inspection to be less liable to be reduced.

As illustrated in FIG. 1 and FIG. 2, the sheet 4 is disposed in a region of the upper surface of the inspection stage 1 surrounded by the recess 1c (see FIG. 3) in plan view. The porous sheet 5 is disposed on the sheet 4.

A recess 1b (an example of second recess) is provided in a region of the upper surface of the inspection stage 1 surrounded by the recess 1c in plan view. The sheet 4 is disposed in the recess 1b.

A hole 4a, a hole 4b, a hole 4c, a hole 4d, which are holes that penetrate from the upper surface to the lower surface, are provided in the sheet 4. The sheet 4 is disposed in the recess 1b so that the hole 4a, the hole 4b, the hole 4c, and the hole 4d each at least partially overlap the opening 1a of the exhaust hole 1e.

It is only necessary that the sheet 4 include at least one hole that penetrates from the upper surface to the lower surface, and it is only necessary that at least one of the at least one hole be disposed so as to overlap the opening 1a of the exhaust hole 1e. Air between the upper surface of the inspection stage 1 and the semiconductor substrate 6 passes through the porous sheet 5 and at least one of the at least one hole of the sheet 4, and is then exhausted through the exhaust hole 1e.

When the semiconductor substrate 6 placed on the O-ring 2 is vacuum-sucked with the exhaustion through the exhaust hole 1e, a part of the semiconductor substrate 6 inside the O-ring 2 in plan view is pulled toward the inspection stage 1 side, causing the semiconductor substrate 6 to be deformed. When the center part of the semiconductor substrate 6 is supported by the sheet 4 and the porous sheet 5, the semiconductor substrate 6 is made less liable to be deformed when the space Sp is evacuated. For example, by adjusting the thickness of the sheet 4 and the porous sheet 5, the deformation amount of the semiconductor substrate 6 when the space Sp is evacuated can be adjusted.

Adhesion between the substrate and the O-ring 2 and adhesion between the O-ring 2 and the inspection stage varies in accordance with the deformation amount of the semiconductor substrate 6 when the space Sp is evacuated, which causes airtightness of the space Sp to vary. MG. 7 illustrates a relationship between a height difference h of the semiconductor substrate 6 and a pressure difference of the space Sp when the space Sp is evacuated.

The height difference h represents how high the height of the upper surface of the semiconductor substrate 6 at the position of the O-ring 2 in a state in which the space Sp is evacuated is in comparison to the height of the upper surface of the semiconductor substrate 6 at the center of the ring shape of the recess 1c (see FIG. 6). In FIG. 6, the positions for measuring the height difference h are indicated by arrows.

The pressure difference of the space Sp represents a difference between the pressure of the space Sp measured in Step S306 of the inspection method described in <A-2. Inspection Method and Manufacturing Method> and the pressure of the space Sp measured in Step S308, and represents how much of outside air leaks to the space Sp between Step S306 and Step S308. The results shown in FIG. 7 are all measured by changing the height difference h, which is changed by changing structures of the sheet 4 and the porous sheet 5, and conditions other than the structures of the sheet 4 and the porous sheet 5 are the same in each measurement.

As illustrated in FIG. 7, the pressure difference of the space Sp is low when the height difference h is 0.1 mm or more and 0.9 mm or less. In other words, by setting the height difference h to 0.1 mm or more and 0.9 mm or less, there is less leakage caused due to the structure of the inspection stage 1, and sensitivity of detecting a through hole in the semiconductor substrate 6 can be enhanced.

In order to set the height difference h to 0.1 mm or more and 0.9 mm or less, for example, in a state in which the space Sp is not evacuated, the height of the upper edge of the O-ring 2 disposed in the recess 1c is set to be higher than the height at the center of the ring shape of the recess 1c of the upper surface of the porous sheet 5 disposed on the sheet 4 disposed in the upper surface of the inspection stage 1 by 0.1 mm or more and 0.9 mm or less.

The sheet 4 is elastic, for example. When the sheet 4 is elastic, the semiconductor substrate 6 when the space Sp is evacuated has a curved state as a whole including the center and its periphery, and thus deformation of the semiconductor substrate 6 can be made less liable to locally occur near the O-ring 2. Accordingly, deformation of the semiconductor substrate 6 near the O-ring 2 is eased, adhesion between the O-ring 2 and the semiconductor substrate 6 is made less liable to be reduced, and detection sensitivity of a through hole is made less liable to be reduced.

The sheet 4 may have a structure that the upper surface is curved and the upper surface is recessed due to the curve. With this, the semiconductor substrate 6 when the space Sp is evacuated has a curved state as a whole including the center and its periphery, and thus deformation of the semiconductor substrate 6 can be made less liable to locally occur near the O-ring 2. Accordingly, deformation of the semiconductor substrate 6 near the O-ring 2 is eased, adhesion between the O-ring 2 and the semiconductor substrate 6 is made less liable to be reduced, and detection sensitivity of a through hole is made less liable to be reduced.

The substrate container 13 illustrated in FIG. 15 is a container for accommodating the semiconductor substrate 6.

The conveyor hand 14 is for conveying the semiconductor substrate 6.

The substrate guide 9 is, as illustrated in FIG. 11 to FIG. 14, disposed around the inspection stage 1. The substrate guide 9 is used when, for example, the semiconductor substrate 6 is placed on the inspection stage 1, or when the semiconductor substrate 6 is taken out of the inspection stage 1.

The aligner 15 is for adjusting the orientation and the position of the semiconductor substrate 6 when the semiconductor substrate 6 is set in the inspection unit 41. For example, the semiconductor substrate 6 is taken out of the substrate container 13 by using the conveyor hand 14, the semiconductor substrate 6 is set in the aligner 15, and the orientation and the position of the semiconductor substrate 6 are adjusted by the aligner 15. Subsequently, the semiconductor substrate 6 is conveyed from the aligner 15 to the substrate guide 9 by the conveyor hand 14. With the conveyor hand 14 on which the semiconductor substrate 6 is placed being lowered through a gap 9a from the top of the substrate guide 9, the semiconductor substrate 6 is placed on the substrate guide 9. Position shift avoidance pins 10 are disposed on the upper surface of the substrate guide 9, and owing to the position shift avoidance pins 10, the position of the semiconductor substrate 6 is regulated.

After the semiconductor substrate 6 is placed on the substrate guide 9 as illustrated in FIG. 11 and FIG. 12, the substrate guide 9 is lowered, and as illustrated in FIG. 13 and FIG. 14, the semiconductor substrate 6 is thereby placed on the inspection unit 41. After inspection, the substrate guide 9 is lifted, and the semiconductor substrate 6 is thereby placed on the substrate guide 9. The semiconductor substrate 6 placed on the substrate guide 9 is picked up by the conveyor hand 14. Subsequently, the semiconductor substrate 6 is collected in the substrate container 13, for example. According to the structure of the inspection device 101 as described above, inspection as to whether or not there is a through hole in the semiconductor substrate 6 can be automated. Further, inspection can be performed with less contact with the surface of the semiconductor substrate 6 being involved.

Figure 20:
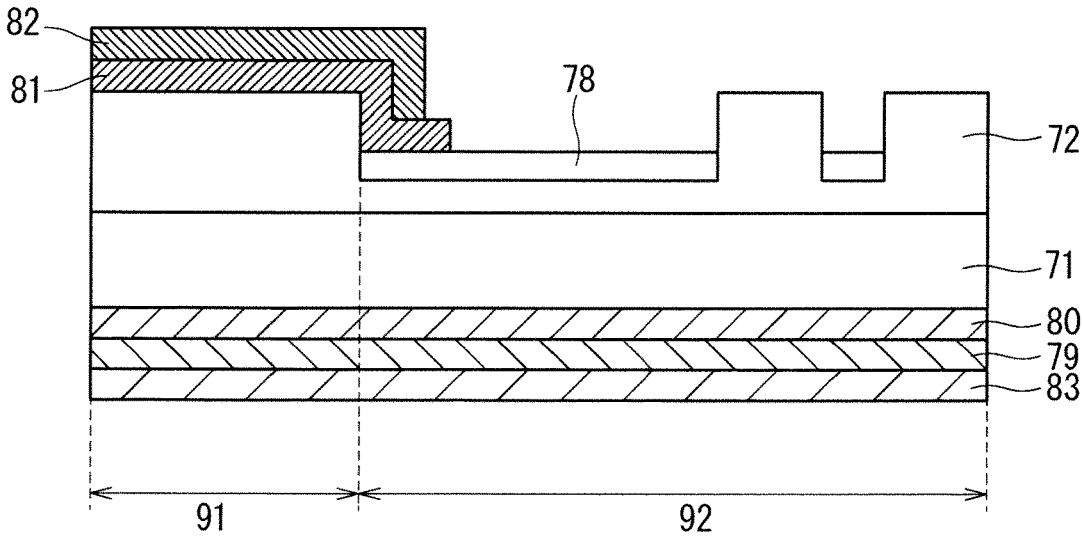
FIG. 20 is a diagram illustrating an example of the semiconductor device manufactured using the manufacturing method of the semiconductor device according to the first embodiment.

FIG. 20 is a cross-sectional diagram of a semiconductor element 200 being an example of a semiconductor device manufactured using a manufacturing method of a semiconductor device according to the present embodiment. The semiconductor element 200 is a Schottky barrier diode.

The semiconductor element 200 includes, in an active part 91, a SiC substrate 71, a SiC drift layer 72 formed on the upper surface of the SiC substrate 71, a Ni layer 79 formed below the SiC substrate 71, a Ni silicide layer 80 formed at the interface between the SiC substrate 71 and the Ni layer 79, an Au layer 83 formed on the lower surface of the Ni layer 79, a Ti layer 81 formed on the upper surface of the SiC drift layer 72, and an Al layer 82 formed on the Ti layer 81.

A guard ring 78 is formed in a termination part 92 located at a position in the semiconductor element 200 different from the active part 91 in plan view. The Ti layer 81 is formed across the upper surface of the guard ring 78 and the upper surface of the SiC drift layer 72. The termination part 92 is, for example, formed to surround the active part 91 in plan view.

<A-2. Inspection Method and Manufacturing Method>

FIG. 8 is a flowchart illustrating a manufacturing method of a semiconductor device according to the present embodiment.

First, in Step S1, the semiconductor substrate 60 is prepared (see FIG. 21). Next, in Step S2, an epitaxial layer 61 is formed on the semiconductor substrate 60 through epitaxial growth (see FIG. 22). The semiconductor substrate in which the epitaxial layer 61 is formed on the semiconductor substrate 60 is referred to as the semiconductor substrate 6.

Next, inspection of the semiconductor substrate 6 is performed (Step S3). Step S3 corresponds to an inspection method of the semiconductor substrate according to the present embodiment. Step S3 will be described later in detail.

In Step S3, when it is determined that there is a through hole in the semiconductor substrate 6 (Step S4: Yes), the semiconductor substrate 6 is eliminated from the manufacture process, and no subsequent manufacture process is performed on the semiconductor substrate 6 (Step S5).

In Step S3, when it is determined that there is no through hole in the semiconductor substrate 6 (Step S4: No), a wafer process is performed so that a semiconductor element is formed on the semiconductor substrate 6 (Step S6). The semiconductor element formed on the semiconductor substrate 6 includes, for example, an active part and a termination part, and in that case, in Step S6, an active part and a termination part are each formed in the semiconductor substrate 6.

Subsequently, in Step S7, dicing is performed, with the result that separate semiconductor elements are obtained.

The semiconductor element formed on the semiconductor substrate 6 in Step S6 is the semiconductor element 200 described in the above, for example (see FIG. 20). In that case, the SiC substrate 71 of the semiconductor element 200 corresponds to the semiconductor substrate 60, and the SiC drift layer 72 of the semiconductor element 200 corresponds to the epitaxial layer 61.

The semiconductor element formed on the semiconductor substrate 6 in Step S6 may be, for example, a metal oxide semiconductor field effect transistor (MOSFET), a PN diode, an insulated gate bipolar transistor (IGBT), or a reverse-conducting IGBT (RC-IGBT).

In Step S6, when the wafer process is performed on the semiconductor substrate 6 having a through hole, various problems occur in each process in the wafer process, inhibiting stable manufacture. For example, poor drying may occur in a cleaning process, and a leak of a resist or a liquid developer may occur in a photolithographic process. Further, such poor drying and leak may lead to contamination of facility for later processes or the like. In addition, process failure may occur due to leakage of a heat transfer gas in a vacuum process device. When inspection of Step S3 is performed before the wafer process, and the semiconductor substrate 6 having a through hole is eliminated in advance as in Step S5, for example, the problems as described above are made less liable to occur in the wafer process, and productivity can thus be enhanced.

The semiconductor substrate 6 is, for example, a silicon carbide substrate. Semiconductor elements using a silicon carbide substrate have been under development as switching elements enabling implementation of a high breakdown voltage, low loss, and high temperature resistance. Such semiconductor elements using a silicon carbide substrate have been more widely applied to power semiconductor devices such as inverters. The crystal growth technology for silicon carbide is still in the process of being developed, and a large number of crystal defects exist in the silicon carbide substrate. One of the defects formed in the silicon carbide substrate is a screw dislocation with a hollow structure. The screw dislocation with a hollow structure is also referred to as a micropipe. The hollow structure is a structure that may have a through hole penetrating from the upper surface of the substrate to the lower surface.

In the above description, when it is determined that there is a through hole in the semiconductor substrate 6, the semiconductor substrate 6 is eliminated from the manufacture process in Step S5, and no subsequent manufacture process is performed on the semiconductor substrate 6. However, even when it is determined that there is a through hole in the semiconductor substrate 6, a subsequent manufacture process may be performed. When it is determined that there is a through hole, for example, a subsequent manufacture process is performed with a method different from that for a case in which it is determined that there is no through hole.

Parts of the flowchart of FIG. 8 other than Step S6 and Step S7 correspond to the manufacturing method of the semiconductor substrate according to the present embodiment. In the manufacturing method of the semiconductor substrate, the semiconductor substrate determined to have a through hole may be eliminated and only the semiconductor substrate determined not to have a through hole may be regarded as a finished product, and both the semiconductor substrates may be regarded as finished products with different qualities depending on whether or not they have a through hole.

The method of inspection of Step S3 will be described. FIG. 9 is a flowchart illustrating details of Step S3. FIG. 10 is a diagram schematically illustrating variation of the pressure of the space Sp in Step S3. In FIG. 10, variation of the pressure when there is a through hole is indicated by the broken line, and variation of the pressure when there is a through hole is indicated by the solid line. The variations of the pressures are different even at or before time $t_2$ in a case with a through hole and a case without a through hole; however, in FIG. 10, such a difference at or before time $t_2$ in a case with a through hole and a case without a through hole is omitted.

First, in Step S301, the semiconductor substrate 6 is set on the inspection stage 1. The semiconductor substrate 6 is placed on the O-ring 2 disposed in the recess 1c. The O-ring 2 is pressed inward by the ring 3 and is pressed toward the inner side surface of the recess 1c.

After Step S301, the vacuum pump 17 is turned on (Step S302). Next, the valve 12 is put in an open state at time $t_1$ (Step S303). With this, exhaustion from the space Sp through the exhaust hole 1e is performed, and the semiconductor substrate 6 is vacuum-sucked.

Next, when it is confirmed that the pressure of the space Sp falls to or below a set pressure (Step S304), the valve 12 is put in a closed state at the time $t_2$ (Step S305). It is only necessary that the set pressure be an atmospheric pressure or lower; however, it is preferable that the set pressure be lower in order to enhance sensitivity of inspection. In the present embodiment, the set pressure is 0.1 Pa.

After a necessary time period has elapsed from when the valve 12 is put in a closed state in Step S305 to when the pressure is stabilized, the pressure is also measured at time $t_3$ (Step S306). Subsequently, a predetermined standby time period is provided (Step S307), and at time $t_4$, the pressure is measured again (Step S308).

Subsequently, based on the pressure measured in Step S306 and Step S308, whether or not there is a through hole is determined (Step S309). For example, a difference $p_1-p_0$, a difference between $p_1$ and $p_0$, is compared to a predetermined threshold $p_{th}$. When $p_1-p_0$ is larger than $p_{th}$, that is, when $p_1$ is larger than $p_0+p_{th}$, it is determined that there is a through hole; otherwise, it is determined that there is no through hole. FIG. 10 illustrates, as an example, the pressures $p_0$ and $p_1$ measured in Step S306 and Step S308 when there is a through hole in the semiconductor substrate 6.

After Step S309, in Step S310, the space Sp is exposed to air so that the semiconductor substrate 6 is not vacuum-sucked to the inspection stage 1, and in Step S311, the semiconductor substrate 6 is taken out of the inspection unit 41.

Through the processes described above, inspection ends.

In the description above, the pressure is measured in S306 and S308, and whether or not there is a through hole is determined using a difference of the pressures obtained in the two times of measurement. However, the method for determining whether or not there is a through hole is not limited to such a method, and any method may be used as long as the degree of leakage of outside air to the space Sp can be measured. For example, the measurement at the time $t_3$ may not be performed and only the measurement of the degree of pressure at the time $t_4$ may be performed, and whether or not there is a through hole may be determined based on the degree of the pressure of the space Sp at the time $t_4$. Further, more generally, whether or not there is a through hole may be determined based on variation of the pressure of the space Sp.

In the description above, whether or not there is a through hole is determined in Step S309. However, more generally, quality of the semiconductor substrate 6 may be determined. The quality of the semiconductor substrate 6 is, for example, quality based on whether or not there is a through hole, the number of through holes, or the size of the through hole(s).

B. Second Embodiment

The inspection device according to the second embodiment is different from the inspection device 101 according to the first embodiment in that the inspection device includes an inspection unit 42 instead of the inspection unit 41. Except for the difference, the inspection device according to the second embodiment is the same as the inspection device 101 according to the first embodiment.

FIG. 16 is a plan view illustrating the inspection unit 42. FIG. 17 is a cross-sectional diagram of the inspection unit 42 taken along the line B-B of FIG. 16.

The inspection unit 42 is different from the inspection unit 41 of the inspection device 101 according to the first embodiment in that the inspection stage 1 includes an air hole 7. Except for the difference, the inspection unit 42 is the same as the inspection unit 41 of the inspection device 101 according to the first embodiment. The air hole 7 is an air hole that connects the recess 1c (see FIG. 3) of the inspection stage 1 and the space Sp.

Owing to the presence of the air hole 7, a region surrounded by the side surface and the bottom surface of the recess 1c of the inspection stage 1 and the O-ring 2 is evacuated in advance, which eliminates dead air spaces. Thus, the degree of vacuum at the time of inspection is made less liable to deteriorate. Further, the evacuation of the region causes the O-ring 2 to be pulled in the inner direction, and thus adhesion between the O-ring 2 and the inspection stage 1 is enhanced, and the outside air is made less liable to leak to the space Sp through a portion between the O-ring 2 and the inspection stage 1. Although FIG. 16 illustrates a case in which four air holes 7 are provided, at least one air hole 7 suffices.

C. Third Embodiment

The inspection device according to the third embodiment is different from the inspection device according to the second embodiment in that the inspection device includes an inspection unit 43 instead of the inspection unit 42. Except for the difference, the inspection device according to the third embodiment is the same as the inspection device according to the second embodiment.

Figure 19:
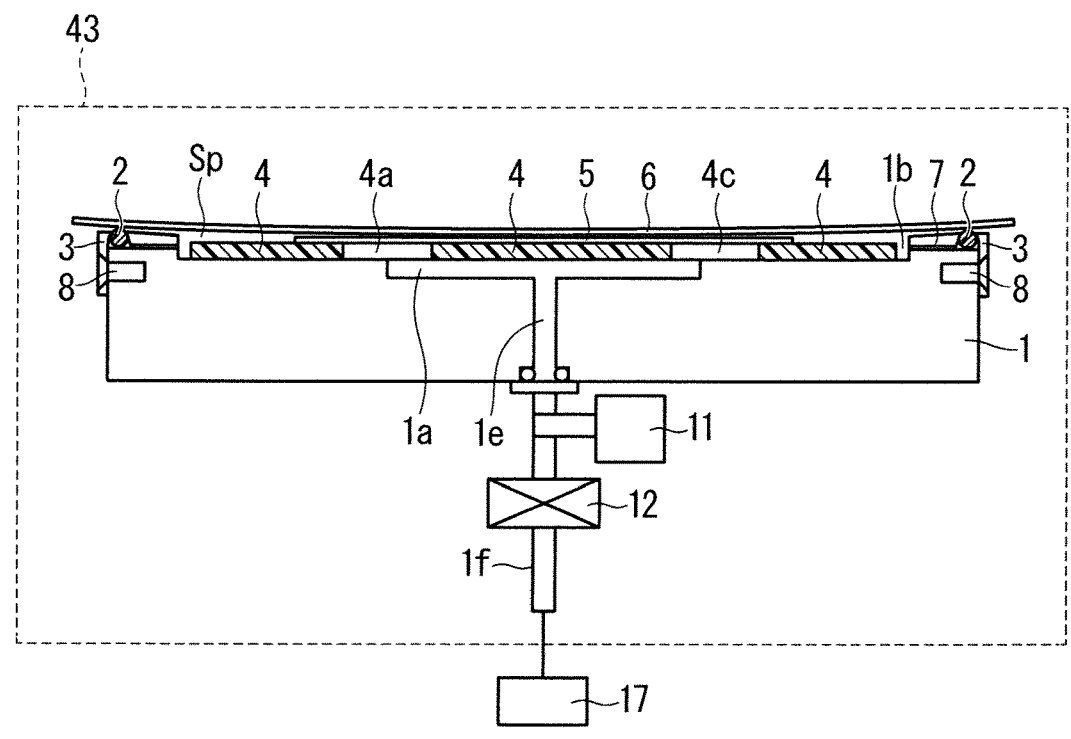
FIG. 19 is a diagram illustrating the inspection unit of the inspection device according to the third embodiment.

FIG. 18 is a diagram illustrating the inspection unit 43. FIG. 19 is a cross-sectional diagram of the inspection unit 43 taken along the line C-C of FIG. 18.

In the inspection unit 43, the upper surface of the inspection stage 1 inclines so that the recess 1c (see FIG. 3) side is higher and the recess 1b side is lower between the recess 1b and the recess 1c. Except for the difference, the inspection unit 43 is the same as the inspection unit 42 of the inspection device according to the second embodiment.

With the upper surface of the inspection stage 1 inclining so that the recess 1c side is higher and the recess 1b side is lower between the recess 1b and the recess 1c, the semiconductor substrate 6 and the inspection stage 1 can be made less liable to come in contact with each other due to deformation of the semiconductor substrate 6 caused by evacuation of the space Sp. Accordingly, adhesion between the semiconductor substrate 6 and the O-ring 2 can be made less liable to be reduced, and the outside air can be made less liable to leak to the space Sp through a portion between the semiconductor substrate 6 and the O-ring 2.

With the upper surface of the inspection stage 1 having an inclination along the semiconductor substrate 6 being deformed due to evacuation of the space Sp, the semiconductor substrate 6 and the upper surface of the inspection stage 1 can be made less liable to come in contact with each other, and by reducing the volume of the space Sp, sensitivity of detecting a through hole can be enhanced.

The inclination between the recess 1b and the recess 1c in the upper surface of the inspection stage 1 may be a step-wise inclination.

Note that each embodiment can be freely combined, and each embodiment can be modified or omitted as appropriate.

While the disclosure has been shown and described in detail, the foregoing description is in all aspects illustrative and not restrictive. It is therefore understood that numerous modifications and variations can be devised.

What is claimed is:

1. An inspection device that inspects a semiconductor substrate, comprising:
   a stage;
   a first ring; and
   a second ring, wherein
   a first recess is provided on an upper surface of the stage and a side surface of the stage, such that a side opening is provided on the side surface of the stage,
   the first recess has a ring shape in plan view,
   the first ring is elastic,
   the first ring is disposed in the first recess,
   the second ring presses the first ring in an inward direction of the ring shape so as to press the first ring toward an inner side surface of a side surface of the first recess,
   the first ring projects toward an upper side further than the upper surface of the stage,
   in the stage, an exhaust hole is provided, the exhaust hole including an opening in a region of the upper surface of the stage surrounded by the first recess in plan view, and
   the semiconductor substrate placed on the first ring is vacuum-sucked with exhaustion through the exhaust hole.

2. The inspection device according to claim 1, wherein the inner side surface of the side surface of the first recess inclines so that an upper side of the inner side surface is located on an outer side of the stage than a lower side of the inner side surface.

3. The inspection device according to claim 1, further comprising
   a vacuum pump and a pressure gauge, wherein
   the exhaustion is performed using the vacuum pump, and
   the pressure gauge measures a pressure of a region surrounded by the semiconductor substrate, the first ring, and the stage.

4. The inspection device according to claim 1, wherein the first ring is an O-ring.

5. An inspection method of a semiconductor substrate using the inspection device according to claim 1, the inspection method comprising:
   placing the semiconductor substrate on the first ring;
   vacuum-sucking the semiconductor substrate placed on the first ring with the exhaustion while pressing the first ring in the inward direction by using the second ring; and
   measuring a pressure of a region surrounded by the semiconductor substrate, the first ring, and the stage.

6. The inspection method of the semiconductor substrate according to claim 5, wherein
   in the measurement, a height of an upper surface of the semiconductor substrate at a position of the first ring is higher than the height of an upper surface of the semiconductor substrate at a center of the ring shape of the first recess by 0.1 mm or more and 0.9 mm or less.

7. The inspection method of the semiconductor substrate according to claim 5, wherein
   quality of the semiconductor substrate is determined based on results of the measurement.

8. The inspection method of the semiconductor substrate according to claim 5, wherein
   whether or not there is a through hole in the semiconductor substrate is determined based on results of the measurement.

9. A manufacturing method of a semiconductor substrate, comprising:
   preparing a semiconductor substrate; and
   performing inspection of the semiconductor substrate by using the inspection method of the semiconductor substrate according to claim 5.

10. The manufacturing method of the semiconductor substrate according to claim 9, further comprising:
    forming an epitaxial layer on the semiconductor substrate through epitaxial growth; and
    performing the inspection of the semiconductor substrate after the forming of the epitaxial layer.

11. A manufacturing method of a semiconductor device, comprising:
    preparing a semiconductor substrate manufactured by using the manufacturing method of the semiconductor substrate according to claim 9; and
    forming a semiconductor element on the semiconductor substrate.

12. An inspection method of a semiconductor substrate using the inspection device according to claim 1, the inspection method comprising:
    placing the semiconductor substrate on the first ring;
    vacuum-sucking the semiconductor substrate placed on the first ring with the exhaustion while pressing the first ring in the inward direction by using the second ring; and
    measuring a degree of leakage of outside air to a region surrounded by the semiconductor substrate, the first ring, and the stage.

13. The inspection method of the semiconductor substrate according to claim 12, wherein
    in the measurement, a height of an upper surface of the semiconductor substrate at a position of the first ring is higher than the height of an upper surface of the semiconductor substrate at a center of the ring shape of the first recess by 0.1 mm or more and 0.9 mm or less.

14. The inspection method of the semiconductor substrate according to claim 12, wherein
    quality of the semiconductor substrate is determined based on results of the measurement.

15. The inspection method of the semiconductor substrate according to claim 12, wherein
    whether or not there is a through hole in the semiconductor substrate is determined based on results of the measurement.

16. A manufacturing method of a semiconductor substrate, comprising:
    preparing a semiconductor substrate; and
    performing inspection of the semiconductor substrate by using the inspection method of the semiconductor substrate according to claim 12.

17. The manufacturing method of the semiconductor substrate according to claim 16, further comprising:
    forming an epitaxial layer on the semiconductor substrate through epitaxial growth; and
    performing the inspection of the semiconductor substrate after the forming of the epitaxial layer.

18. A manufacturing method of a semiconductor device, comprising:
  preparing a semiconductor substrate manufactured by using the manufacturing method of the semiconductor substrate according to claim 16; and
  forming a semiconductor element on the semiconductor substrate.

19. An inspection device that inspects a semiconductor substrate, comprising:
  a stage;
  a first ring;
  a second ring, wherein
  a first recess is provided on an upper surface of the stage,
  the first recess has a ring shape in plan view,
  the first ring is elastic,
  the first ring is disposed in the first recess,
  the second ring presses the first ring in an inward direction of the ring shape so as to press the first ring toward an inner side surface of a side surface of the first recess,
  the first ring projects toward an upper side further than the upper surface of the stage,
  in the stage, an exhaust hole is provided, the exhaust hole including an opening in a region of the upper surface of the stage surrounded by the first recess in plan view, and
  the semiconductor substrate placed on the first ring is vacuum-sucked with exhaustion through the exhaust hole;
  a first sheet disposed in a region of the upper surface of the stage surrounded by the first recess in plan view; and
  a second sheet disposed on the first sheet, wherein
  the second sheet is a porous sheet.

20. The inspection device according to claim 19, wherein the first sheet is elastic.

21. The inspection device according to claim 19, wherein an upper surface of the first sheet is curved, and
  the upper surface of the first sheet is recessed due to the curve.

22. The inspection device according to claim 19, wherein the first sheet includes at least one hole penetrating from the upper surface to a lower surface, and
  the exhaustion is performed through at least one of the at least one hole of the first sheet and the second sheet.

23. The inspection device according to claim 19, wherein an upper edge of the first ring disposed in the first recess is higher than a height at a center of the ring shape of the first recess of an upper surface of the second sheet disposed on the first sheet disposed on the upper surface of the stage by 0.1 mm or more and 0.9 mm or less.

24. The inspection device according to claim 19, wherein a second recess is provided on the upper surface of the stage,
  the second recess is surrounded by the first recess in plan view, and
  the first sheet is disposed in the second recess.

25. The inspection device according to claim 24, wherein in the stage, an air hole connecting the first recess and the second recess is provided.

26. The inspection device according to claim 24, wherein the upper surface of the stage inclines so that a side of the first recess is higher and a side of the second recess is lower between the first recess and the second recess.

* * * * *